United States Patent [19]
Liedenbaum et al.

[11] Patent Number: 5,701,396
[45] Date of Patent: Dec. 23, 1997

[54] MULTIMODE-LASER FOR AN OPTICAL INFORMATION PROCESSING SYSTEM SUCH AS A NEURAL NET

[75] Inventors: Coen T. H. F. Liedenbaum; Sel B. Colak; Johannes J. H. B. Schleipen, all of Eindhoven, Netherlands

[73] Assignee: U.S. Philips Corporation, New York, N.Y.

[21] Appl. No.: 345,023

[22] Filed: Nov. 23, 1994

[30] Foreign Application Priority Data

Nov. 26, 1993 [EP] European Pat. Off. ............. 93203308

[51] Int. Cl.⁶ .................. G06G 9/00; H01S 3/13
[52] U.S. Cl. ................ 395/25; 364/713; 364/822
[58] Field of Search ................ 395/25; 364/822, 364/713

[56] References Cited

U.S. PATENT DOCUMENTS

| | | | |
|---|---|---|---|
| 3,858,031 | 12/1974 | Kornfeld | 235/61.11 E |
| 4,074,361 | 2/1978 | Clow | 364/713 |
| 4,926,367 | 5/1990 | Arrathoon | 395/25 |
| 5,040,135 | 8/1991 | Aleksoff et al. | 364/602 |
| 5,040,182 | 8/1991 | Spinelli et al. | 372/18 |
| 5,115,444 | 5/1992 | Kirkby et al. | 372/50 |
| 5,129,058 | 7/1992 | Mifune et al. | 395/162 |
| 5,191,574 | 3/1993 | Henshaw et al. | 395/25 |
| 5,319,629 | 6/1994 | Henshaw et al. | 369/103 |
| 5,333,144 | 7/1994 | Liedenbaum et al. | 372/29 |
| 5,390,285 | 2/1995 | Wood | 395/25 |
| 5,504,337 | 4/1996 | Lakowicz et al. | 250/461.2 |
| 5,544,280 | 8/1996 | Liu et al. | 395/25 |

OTHER PUBLICATIONS

Electronic Engineering, Apr. 1990, pp. 18 and 21.
"Variable Sensitivity Photodetector for Optical Neural Networks", J. Ohta et al., Journal of Lightwave Technology, vol. 9, No. 12, pp. 1747–1754, Dec. 1991.
"Associative memories based on message-bearing optical modes in phase-conjugate resonators", A. Yariv and S.-K. Kwong, Optics Letters, vol. 11, No. 3, Mar. 1986, pp. 186–188.

*Primary Examiner*—George B. Davis

[57] ABSTRACT

An optical information processing system comprises a coding unit for individually coding a plurality of optical information carrier waves, and a processing unit for processing the plurality of coded waves. The processing unit has a laser for producing laser light through longitudinal laser mode competition among the waves received.

12 Claims, 5 Drawing Sheets

MULTIMODE-LASER FOR AN OPTICAL INFORMATION PROCESSING SYSTEM SUCH AS A NEURAL NET

BACKGROUND OF THE INVENTION

1. Field of the Invention

The invention relates to an optical information processing system functionally comprised of coding means to individually code a plurality of optical information carrier waves, and processing means coupled to the coding means and operative to process the plurality of coded information carrier waves.

2. Description of the Related Art

Optical Processing

The benefits from optical information processing, i.e., performing calculations and transmission, are manifold when compared to electronic equivalents. First, parallel I/O and connectivity can be greatly increased without substantial penalty in terms of system size, as optical implementations permit large fan-in and fan-out operation and has innate parallelism and dense interconnection capabilities. In contrast, electrically conductive interconnections in electronic computers must be separated by at least a minimum critical distance to avoid interference. Second, optical arrangements are not confined to the restrictions of the, basically, planar configurations inherent to integrated electronic circuitry, thus permitting use of all three dimensions to create a compact system. Third, the operation of optical devices is not susceptible to parasitic effects and system delays to the same extent as electronic devices. The latter's functioning is ultimately determined by parasitic capacitances that have a progressively more pronounced influence as the electronic device's dimensions are further reduced. Accordingly, purely optical processing and transmission is, by its very nature, faster than electronic information handling. Typically, optical processing reigns in the pico-second domain, whereas the electronic systems of today meet their limits typically in the nano-second domain.

For an indication of what is achievable in optical computing see, for example, Electronic Engineering, April 1990, pages 18 and 21. Switches, simple logic gates and memory cells can be implemented with optically operating devices.

Neural Net

A typical example of a known optical information processing system using a light source and an encoding means for controlling a light intensity of the emitted light is discussed in "Variable Sensitivity Photodetector for Optical Neural Networks", J. Ohta et al., Journal of Lightwave Technology, Vol. 9, No. 12, pp. 1747–1754, December 1991. This prior art reference relates to a partly optical implementation of a neural net.

In general, a neural net is an information handling system for mapping an input representation onto an output representation, using distributed and highly parallel processing by densely interconnected, simple processors called "neurons". The interconnections between the neurons are called "synapses". Each synapse adaptively assigns a weight (synaptic coefficient) to the signal transferred from a source neuron to a destination neuron. A destination neuron receives signals from a plurality of source neurons and functions as a source neuron itself when supplying an output signal. The destination neuron sums its weighted input signals and produces an output signal by applying an operator to the sum, the operator typically being a non-linear function such as a sigmoid, a bell-shaped function, etc.

Although the topology of the neural net may depend on its application, the net's operation, however, is model-free. That is, neural net operation does not require a pre-specified algorithm. Instead, a neural net adaptively handles information, i.e., while learning from training examples or from operational data while performing its actual task envisaged. Processing in a neural net is achieved in a collective manner. The simple, simultaneous operation of individual neurons and the distribution of information throughout the neural net result in the characteristic functioning of the neural net as a whole. Such an organization enables a plurality of neurons to collectively and simultaneously influence the state of an individual neuron according to the application of simple rules. The processing capability acquired is distributed across the net by encoding the plurality of interconnections between the neurons, rather than storing program instructions in a memory. This particular architecture renders a neural net much more robust than program controlled conventional processors, and is essentially fault-tolerant. A neural net is typically suitable for solving optimization problems, carrying out pattern recognition and performing classification tasks.

Since the number of interconnections among the neurons is perceived to be the limiting factor regarding system performance, optical technology is advocated to solve the interconnect problem that is clearly present in electronic neural net embodiments. Note, however, that optical information processing is not restricted to neural applications. See, for example, Electronic Engineering, April 1990, pages 18 and 21, on a digital optical processor.

The aforesaid Ohta reference discusses a neurochip consisting of an array of a plurality of line-shaped light-emitting diodes (LEDs), and of an interconnection matrix functionally integrated with an array of a plurality of photo-detectors (PDs). Each photo-detector has a sensitivity that is varied under control of an externally applied voltage. The sensitivity then serves as the synaptic coefficient.

The operation of the Ohta neural net basically is as follows. The array of LEDs provides an input vector with components $v_j$ indicating the output power of the j-th LED. The k-th line of interconnected photo-detectors $PD_{km}$ produces an aggregate photo-current $u_k$. Sensitivity of each $PD_{km}$ is set to $w_{km}$ by an appropriate external voltage. As a result, the photo-current produced by the k-th line of interconnected PDs equals: $u_k = \Sigma(w_{kj} v_j)$. In this fashion, the LED's output power is encoded by way of the sensitivity of the associated PD. This aggregate photo-current then is converted into a digital quantity for being submitted to a non-linear function applied by a host computer. In terms of the system parts introduced in the preamble above, the array of LEDs functions as the coding means, whereas the interconnected PDs and the host computer together form the processing means.

The optical neural net of Ohta is typical of the prior art in that the net is a hybrid version, as the optical portion requires an external electronic computer to carry out the non-linear transformation. That is, optical aspects of the prior art device are restricted basically to the operation of an optical crossbar.

SUMMARY OF THE INVENTION

It is an object of the invention to furnish an optical information processing system that essentially extends and enhances optical processing capabilities beyond those of the prior art. It is a further object to provide a fully optical neural net.

The invention therefore provides an optical information processing system as specified in the preamble above, characterized in that the processing means comprises first laser means operative to produce laser light through longitudinal mode competition upon reception of the coded optical information carrier waves.

The invention is based on optical injection or optical feedback of laser light. A laser includes an optical resonant cavity so that multiple reflections occur. This multiple-pass nature of the laser, together with beam coherence, gives rise to an interference-induced longitudinal and transverse mode structure. The longitudinal modes relate to standing-wave patterns in a plane parallel to the laser axis, whereas the transverse modes relate to standing-wave patterns perpendicular to the laser axis. The laser light consists of a plurality of spectral components, referred to as "modi", each particular one thereof being associated with a particular cavity mode and being of a particular frequency. Such a laser is also referred to as a "multi-mode laser". When laser light is injected or fed back, the power is re-distributed over these spectral components. This mechanism driving the re-distribution is commonly referred to as "laser mode competition". The transverse modes are identified by their spatial, typically non-uniform, irradiance distributions. The spatial divergence of the laser beam is larger for the higher-order transverse modes than for the lower-order transverse modes, and cannot be focused to the smallest possible spot attainable for the lowest transverse mode. Also, the higher-order transverse modes suffer higher diffraction losses. Longitudinal modes are not hampered by these disadvantages. As a consequence, the longitudinal modes are used in the optical information processing system of the invention.

The longitudinal modes as well as the transverse modes of laser light can be changed dramatically when optical feedback or optical injection is applied. The eventual resulting spectrum depends on mode competition within the laser and on the power distribution over the spectrum of the radiation supplied to the laser. Typically, the amount of feedback or injection is effective in a range of $10^{-6}$ to 1 of the emitted output power. The high sensitivity of the intensities of the longitudinal modes to external feedback or injection is utilized in the invention to obtain information processing capabilities. The injection of the plurality of coded optical information carrier waves into a laser or feedback of coded information carrier waves, e.g., coded spectral components of the laser, brings about a non-linear collective transformation of the coded information carrier waves through laser mode competition, resulting in a particular type of laser light produced. The expression "laser mode competition" is briefly discussed here. For more details on lasers, see the description below of the accompanying drawing.

In the invention, the coding of the information carrier waves serves to adjust the contributions of the various carrier waves relative to one another when received by the first laser means. The coded carrier waves thereby collectively govern the outcome of the non-linearly operating mode competition mechanism, thus effecting the optical information processing. The coding and mode competition pave the way for substantially increasing the number of information carrier waves that can be furnished or handled by a single laser. Accordingly, the invention is particularly advantageous in the realm of optical parallel information handling and parallel processing. The invention significantly reduces system size and power consumption, while greatly increasing system performance.

The set-up of the invention is particularly relevant to optical neural net implementations. The system may comprise a feedback loop, e.g., to realize a neural net, wherein the first laser means itself is operative to supply the plurality of optical information carrier waves to the coding means. Alternatively, or additionally, the system may include second laser means to provide the plurality of optical information carrier waves. This then furnishes a structure of lasers functionally organized in layers. The second laser means provides the plurality of optical information carrier waves, e.g., spectral components, fed to the first laser means after coding. The first and second laser means each include at least one laser. The coding, e.g., the controlled and individual modification of the intensities of each of the spectral components, between transmission and reception then accounts for the weighting operation performed in the neural net, while the mode competition takes care of the non-linear operation characteristic for the net's neuron. Observe that all neural net operations are executed fully optically.

Coding of the information carrier waves can be accomplished in a variety of ways. For example, if a spectral component is used as an information carrier wave, the laser light is led to a frequency-selective device, such as a grating or an etalon, in order to make the components individually available as separate beams. Thereupon, the spectral components are led to an intensity modifying means with spatially varying properties, such as a fixed mask or an optical disk, or an array of liquid crystal light valves, before being injected or fed back to the laser.

Note that the optical information carrier waves can be represented by physical quantities other than spectral components. For example, light can be thought of as being constituted by a plurality of mutually independent polarization modes that can be used individually as information carrier waves. Discrimination between these polarization modes is accomplished through polarizers and beam-splitters. Also note that in case of pulsed laser systems, another degree of freedom can be added to the characteristics of the laser light, namely, timing. The arrival time of spectral components at a receiving laser plays an important role in the mode competition of the laser. A pulsed laser is sensitive to feedback in a particular time slot only. For background information on pulsed lasers, see European Patent Application EP-A 0 550 929 (PHN 14.300).

Preferably, at least the first laser means or the second laser means includes a semiconductor laser. A typical semiconductor laser is fabricated in a photolithographic technology. Typically, semiconductor lasers are fabricated from the III–V compounds, such as gallium arsenide, indium phosphide, or indium arsenide, or from II–VI and III–V compounds. Lasers based on gallium arsenide lase at wavelengths from 660–900 nm. Lasers based on indium phosphide lase in the range 1300–1550 nm. The semiconductor laser has all the general advantages and convenience of semiconductor devices: it is compact, efficient, inexpensive, rugged, and amenable to mass production. In addition, one of the most important features of semiconductor lasers is their ability to respond to direct, high speed changes in driving current in the order of 10 GHz.

The first and second laser means each may comprise an array of semiconductor lasers that are closely coupled through one or more transverse modes. That is, the semiconductor lasers are located sufficiently close to one another so that a transverse mode in a semiconductor laser affects the competition mechanism in an adjacent one. The mode competition then involves an additional degree of freedom, thereby extending the processing functionalities.

For the sake of completeness, reference is made to: "Associative memories based on message-bearing optical modes in phase-conjugate resonators", A. Yariv and S.-K.

Kwong, Optics Letters, Vol. 11, No. 3, March 1986, pp. 186–188. Yariv et al. disclose a system with an optical resonator that oscillates in a preferred transverse mode, using a phase-conjugate mirror to compensate for distortion within the resonator caused by a volume transmission hologram. The resulting transverse mode represents a stored piece of information. The non-linear mode competition in the laser oscillator is used to create the desired mode provided that the imperfect input furnishes preferential gain. In contrast with the invention, Yariv et al. do not employ longitudinal modes, but a transverse mode to interact with the hologram. Transverse modes have spatial, typically non-uniform, irradiance distributions that are absent in longitudinal modes. The device of Yariv et al. handles one single mode at a time, whereas the system of the invention essentially handles a plurality of different longitudinal modes in parallel. Note that the system of the invention is capable of multiple-input/multiple output processing. The system of Yariv, on the other hand, provides single output only.

BRIEF DESCRIPTION OF THE DRAWING

The invention is explained below by way of example and with reference to the accompanying drawing, wherein.

Throughout the drawing like reference numerals indicate similar or corresponding features.

DESCRIPTION OF THE PREFERRED EMBODIMENTS

Laser

A laser device is a light amplifier, capable of producing a beam of photons having identical scalar and vector properties, such as frequency, phase, direction, and polarization. Laser operation finds its origin in quantum-mechanical effects. In an atom, molecule or crystal, an electron can be stimulated to make a transition from a higher energy level to a lower energy level by an incident photon of the appropriate resonant frequency. The transition then produces a second photon identical in every way to the incident photon. This process is known as stimulated emission. Alternatively, the incident photon can excite an electron to go from the lower to the higher energy level. This phenomenon is known as absorption. In order to have the stimulated emission dominating the absorbtion, the electron population of the higher energy level is increased above that of the lower level, an operation commonly referred to as "population inversion". The population inversion in semiconductor lasers comes about by making sure that the separation between the quasi-Fermi levels exceeds the bandgap of the semiconductor material.

The lasing medium, e.g., a gas or a solid, is usually enclosed in an optical resonant cavity so that multiple reflections increase the photon density and hence the probability of amplification. The multiple-pass nature of the laser, together with beam coherence, gives rise to an interference-induced longitudinal and transverse mode structure, represented by the laser's spectrum. Since only light complying with the standing wave conditions of the resonant cavity is amplified, laser light consists of a plurality of distinct spectral components, also referred to as Fabry-Perot modes. Each particular one thereof is associated with a particular cavity mode and has a particular frequency. Such a laser is known as a "multi-mode laser".

Figure 1:
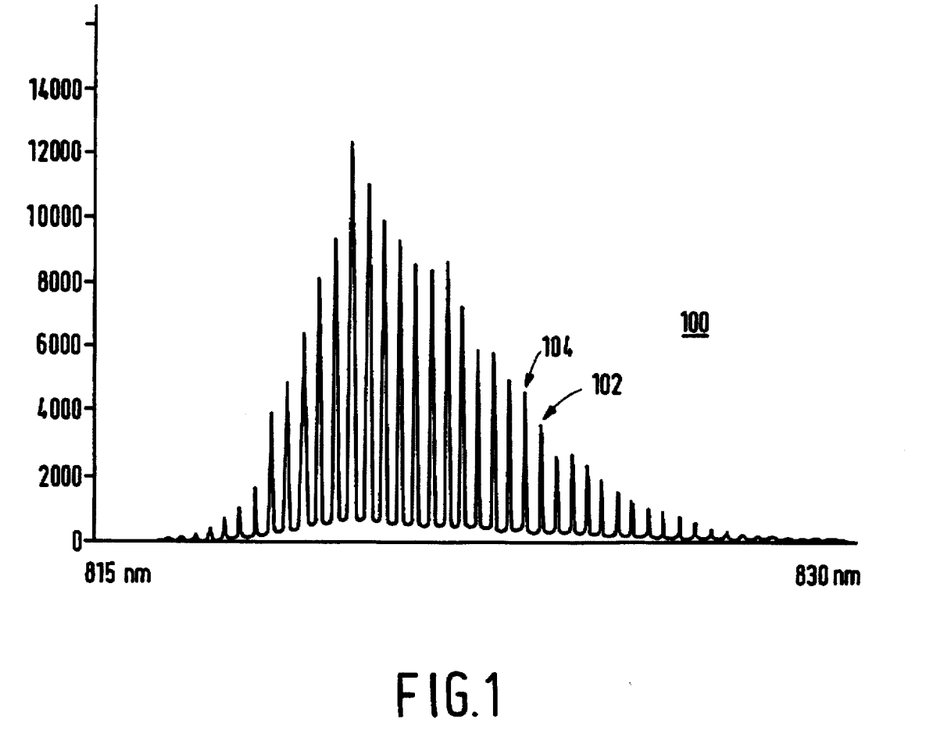
FIG. 1 gives an example of a spectrum of a semiconductor laser.

FIG. 1 is a diagram of a typical semiconductor laser spectrum 100. The horizontal coordinate represents the wavelength in nm, the vertical coordinate the intensity in some unit. The diagram shows the longitudinal mode spectrum to be comprised of a large number of spectral components, also referred to as Fabry-Perot modes, of which only spectral components 102 and 104 are indicated in order to not obscure the drawing. The number of distinct spectral components is determined by the gain bandwidth of the laser medium, typically 10–20 nm for a semiconductor laser and the mode spacing, typically 0.3 nm for the semiconductor laser. In the invention, a plurality of these spectral components are used as information carrier waves.

System Functionalities

Figure 2:
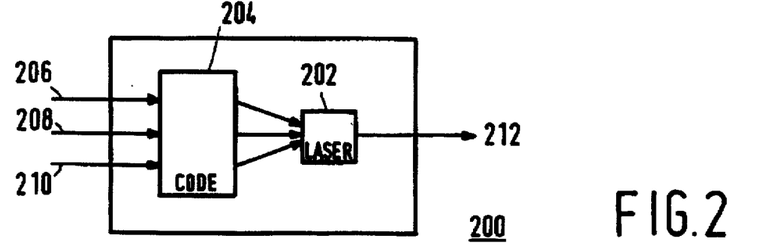
FIGS. 2, 3 and 4 give block diagrams picturing the essentials of the operation in the systems of the invention.
Figure 3:
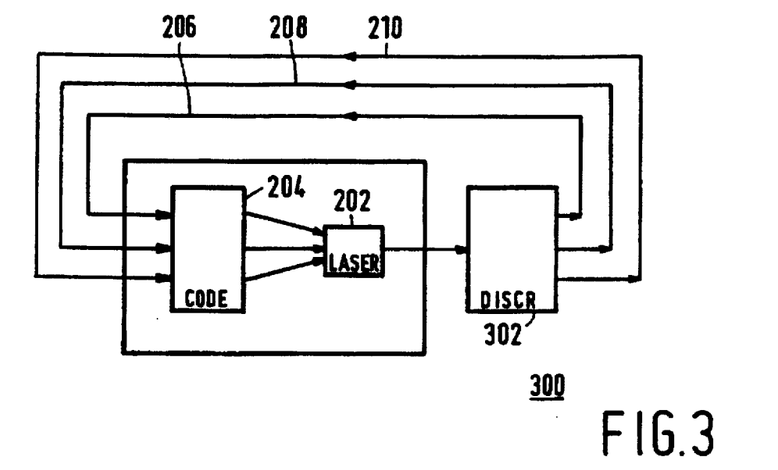
Figure 4:
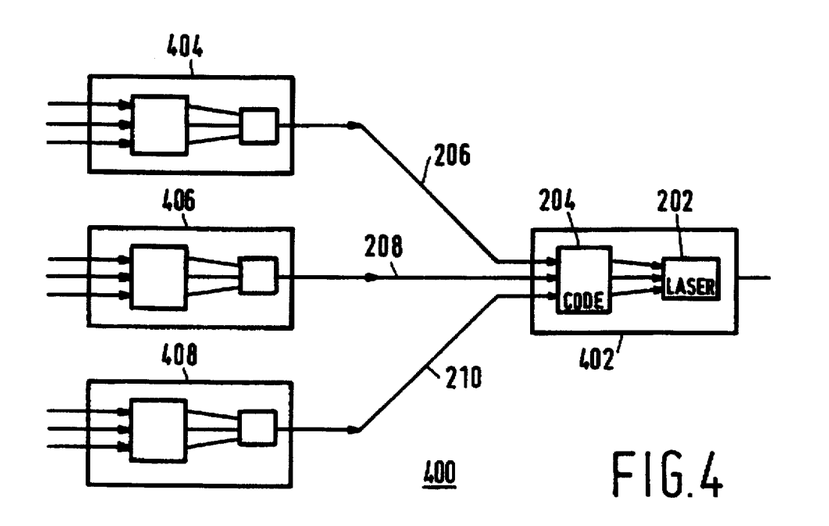

FIGS. 2, 3 and 4 give block diagrams showing various examples of an architecture for an optical information processing system according to the invention.

FIG. 2 gives a diagram of an optical information processing system 200 that comprises a multi-mode laser 202, and a coding means 204 for individually coding a plurality of optical information carrier waves 206, 208, ..., 210. Each of information carrier waves 206–210 is, for example, a respective light beam that comprises one or more spectral components as occurring in the spectrum of laser 202. Each respective one of carrier waves 206–210 is coded by means of coding means 204. Coding means 204 is a device to selectively and individually modify optical properties of the optical information carrier waves, e.g., the light intensities. Laser 202 plays the part of an information processing means for processing of the carrier waves 206–210 after they have passed through coding means 204 in order to produce laser light 212 indicative of the processed coded carrier waves, non-linearly transformed through laser mode competition. In other words, the collective properties of the coded information carrier waves determine the outcome of the laser mode competition.

FIG. 3 gives a diagram of an optical information processing system 300 of the invention that comprises, in addition to parts specified in the discussion of FIG. 2, a discriminating means 302 for discriminating among the spectral components in the laser light produced by laser 202 as explained hereinafter. Assume that laser 202 is active and produces laser light having an initial spectrum. Discriminating means 302, e.g., a grating, an etalon or another wavelength-selective device, then makes the spectral components produced by laser 202 individually available as information carrier waves 206–210 for coding in coding means 204, e.g., on the basis of their intensities, prior to being fed back into laser 202. Feedback causes regenerative energy re-distribution among the Fabry-Perot modes due to mode competition. Mode competition and feedback thus force laser 202 to produce laser light that represents the non-linearly processed coded information carrier waves. System 300 shows a basic architecture of a fully optical neural net as is discussed in detail later.

FIG. 4 gives a diagram of an optical information processing system 400 of the invention comprising a plurality of functionally uniform modules 402, 404, 406 and 408, which collaborate to form a layered information processing structure. Each individual one of modules 402–408 is similar to system 200 of FIG. 2. Module 402 receives the outputs of modules 404–408 in parallel and processes these outputs similarly to system 200 in FIG. 2.

Neural Net Embodiment

Figure 5:
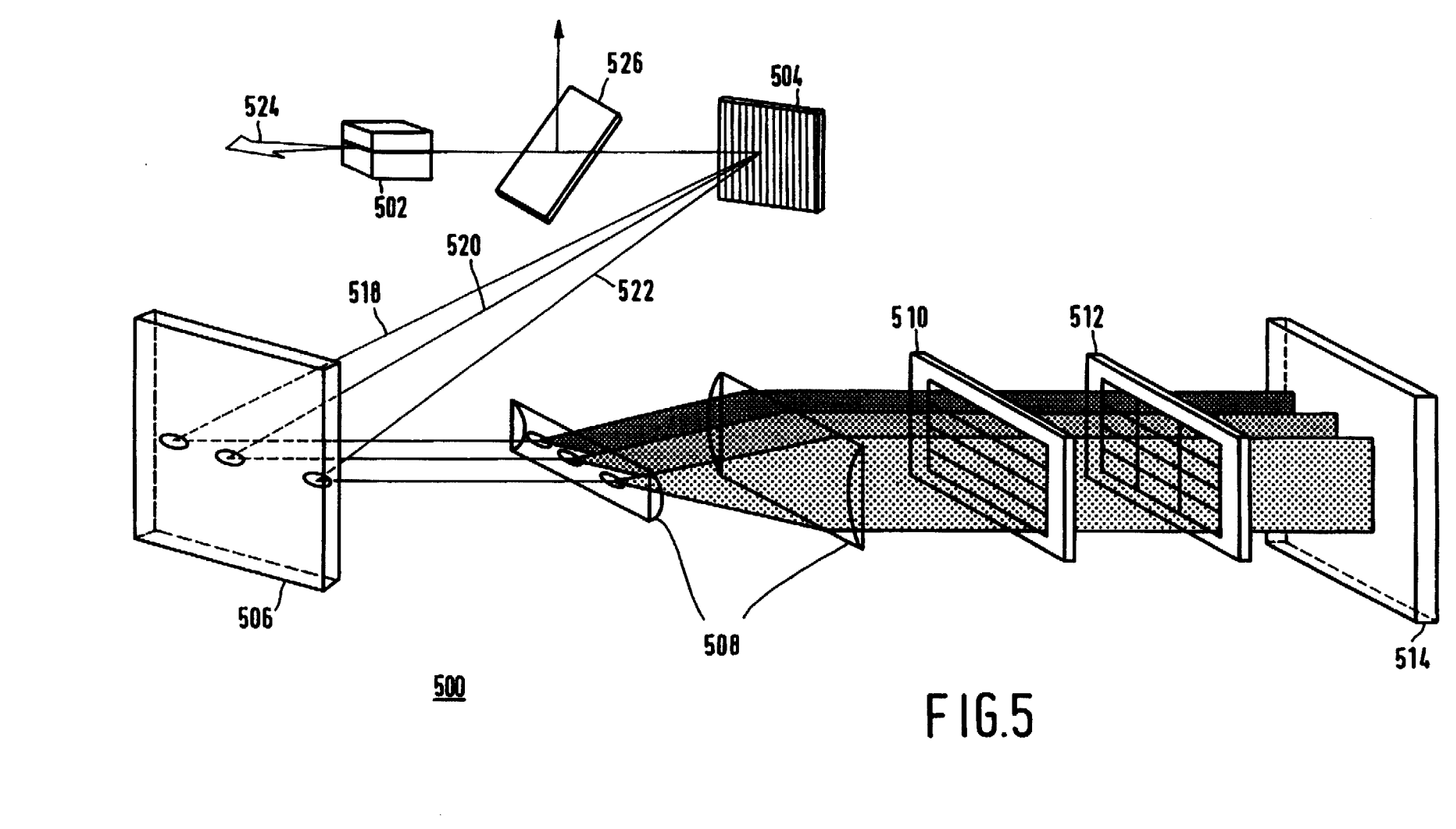
FIGS. 5, 6, 7 and 8 relate to a first detailed example of a neural net according to the invention.

FIG. 5 gives a diagram of a neural net embodiment of an information processing system 500 according to the invention, having the architecture of system 300 discussed with reference to FIG. 3. The operation of neural net 500 is based on controlling the longitudinal modes of an injection laser by external feedback. This approach uses the wavelength-dispersed longitudinal modes of the laser as neurons and the amount of external feedback as connection weights. The intensity of each longitudinal mode is controlled by an external feedback mask, which is designed to act as neural connection weights. This weight mask, together with an input mask, controls the amount of external feedback for each mode individually in order to obtain a desired set of output patterns. The output patterns are given as the resultant longitudinal mode intensities, being the outcome of the mode competition. The number of photons in each mode gives the degree of activation of the neuron corresponding to that mode. The non-linear threshold function needed for sigmoidal neural action is provided by the laser itself. Since a negative light intensity is physically impossible, a zero level is to be defined as having a particular intensity magnitude. An intensity level below this magnitude then is to be handled as a negative contribution, an intensity above this magnitude as a positive one.

System 500 comprises a semiconductor laser 502, a wavelength-selective device, e.g., a grating 504, a first mirror 506, a lens-system 508, an input mask 510, a weight mask 512 and a second mirror 514. Laser 502 emits laser light comprised of a plurality of M spectral components, each respective one thereof being a respective longitudinal laser mode. The spectral components will be referred to hereinafter by an index $m=1, 2, \ldots, M$. The drawing only pictures three of the components with reference numerals 518, 520 and 522 to illustrate the concept. The spectral components are dispersed through grating 504. First mirror 506 directs spectral components 518, 520 and 522 towards lens-system 508. Lens-system 508 appropriately collimates spectral components 518, 520 and 522. Masks 510 and 512 each consist of a device with a spatially varying transparency to modify the light intensities. Preferably, input mask 510 is adjustable under control of input signals as is discussed below.

Figure 6:
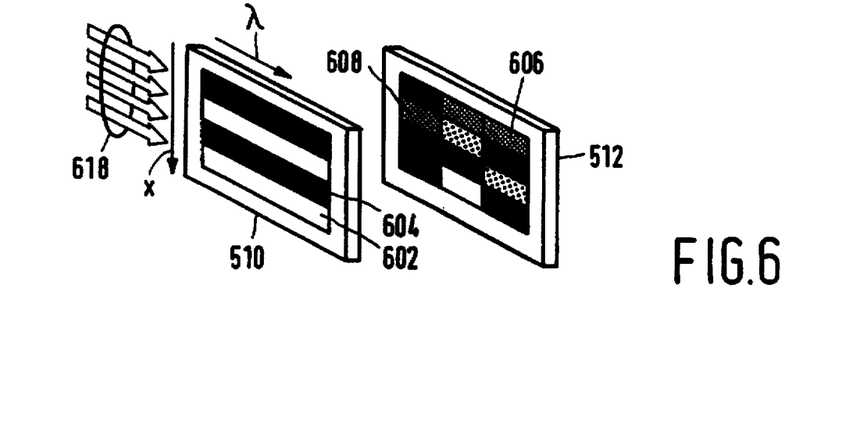

FIG. 6 illustrates masks 510 and 512 in further detail. Input mask 510 has a pattern of opaque and transparent regions, such as 602 and 604. The pattern is uniform in the direction across the path of the collimated spectral components and varies in the transverse direction. For ease of reference, the direction across the path, i.e., in the direction of varying wavelength, will be called the λ-direction, and the transverse direction will be called the x-direction hereinafter. The regions are arranged in the x-direction adjacent one another, each region $j=1, 2, \ldots, J$ having a transparency $t_j = \sqrt{X_j}$. The quantity $X_j$ serves as the j-th input signal to neural net 500. Owing to the input signal's uniformity in the λ-direction, each spectral component $m=1, 2, \ldots, M$ experiences all input signals $X_1, X_2, \ldots, X_J$ simultaneously. The transparency distribution of input mask 510 is rendered controllable via input signals 618. This can be achieved, for example, by an array of individually controllable cells (e.g., liquid crystal light valves or spatial quantum well resonators) to selectively modify the light intensity of the spectral components.

Weight mask 512 has areas, such as areas 606 and 608, e.g., arranged in matrix fashion and identified by indices "m" and "j". Each area$_{m,j}$ has a transparency coefficient $t_{m,j} = \sqrt{W_{m,j}}$. The quantities $W_{m,j}$ serve as the values of the synaptic coefficients of the neural net. A stochastic learning procedure, as known within the field of neural nets, can be employed to determine an acceptable mask. Mask 512 can be implemented by means of, e.g., a fixed slide or a liquid crystal array to render it modifiable. Note that, although masks 510 and 512 have been pictured as separate devices, they can in principle be merged.

After having traversed masks 510 and 512, the spectral components are reflected at second mirror 514 and travel the same way back into laser 502. The fraction of power $R_m$ in laser mode m that is fed back into laser 502 is proportional to the quantity $\Sigma_j(W_{m,j}X_j)$. The optical feedback induces competition among the spectral components. Energy is re-distributed depending on the intensities of the fed-back spectral components m, given by the quantity $\Sigma_j(W_{m,j}X_j)$. It can be shown that the number of photons $P_m$ of the m-th mode depends non-linearly on the power (intensity) $R_m$ of the m-th mode that in this example is fed back into the laser. In good approximation, the dependence is a sigmoid function. The laser itself provides the non-linear operation that is characteristic of a neuron. Thus, the spectrum of the light 524 eventually emerging from laser 502 is the result of a non-linear mapping in a parallel fashion of the input signals $X_j$ being weighted by coefficients $W_{m,j}$ and summed over the modes "m". The laser light produced as a result of the processing of the optical information may also be muted towards further optically processing elements, e.g., a spectrum analyzer or further masks and further semiconductor lasers (not shown), directly as light 524 or via a semi-transparent mirror 526.

Negative-valued light intensities are physically impossible. However, a typical neural net requires both excitatory and inhibitory collaboration between the neurons, implemented by positive and negative weights assigned to the synapses. In the invention this can be achieved by interpreting a light intensity of a particular level as a zero value. A light intensity below this particular level then corresponds to a negative contribution, and a light intensity above the particular level corresponds to a positive contribution. Alternatively, one of input signals 618 can be used as a bias to allow for negative weights.

By an appropriate choice of the spatially varying transparency of masks 510 and 512, laser 502 can be tuned at one or more particular spectral components, driven by the feedback as discussed above. These particular components then acquire a pronounced intensity and show up as predominant modes in the laser's spectrum. The predominant modes of emerging light 524 are obtained in a parallel, distributed and non-linear manner. The particular components then represent the result of the processing of the input signals $X_j$ by neural net 500.

Figure 7:
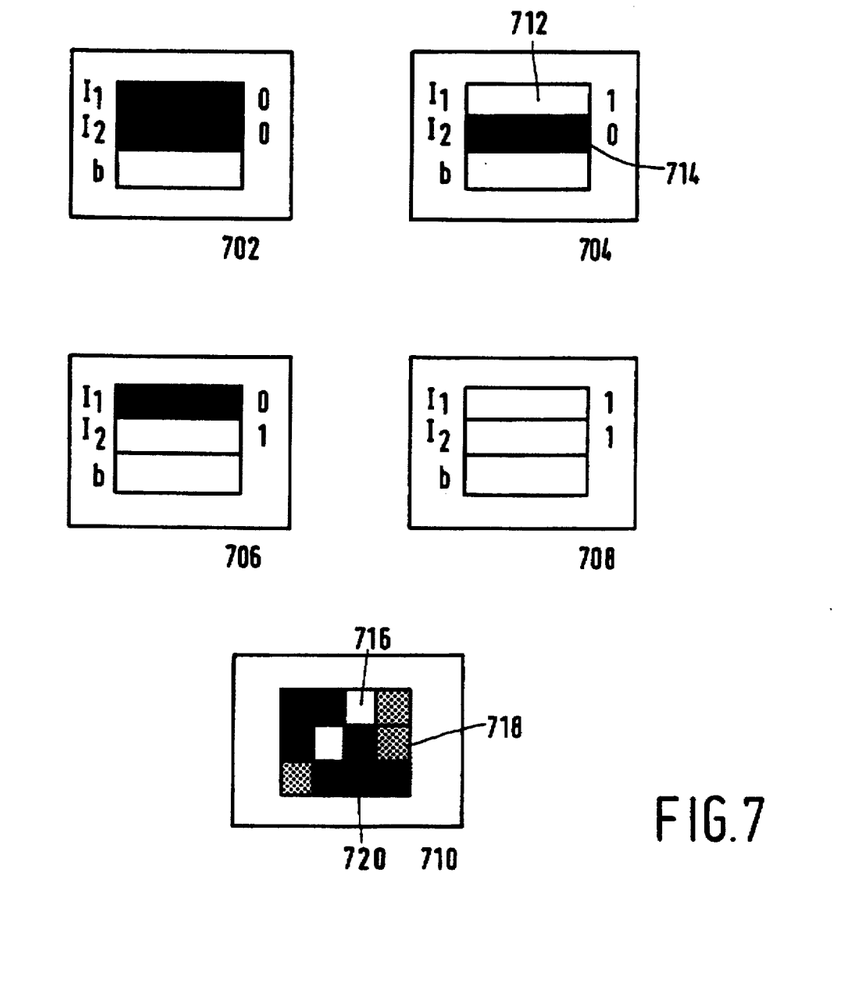

FIG. 7 illustrates input masks 702, 704, 706 and 708 and weight mask 710 for a simple example to handle two input signals $I_1$ and $I_2$ that each can take one of two logic values "0" and "1". Input mask 702 represents the input to system 500 for input signals $I_1$ and $I_2$ both having values 0. Input mask 704 represents the input to system 500 for input signals $I_1$ and $I_2$ having values 1 and 0, respectively. Input mask 706 represents the input to system 500 for input signals $I_1$ and $I_2$ having values 0 and 1, respectively. Input mask 708 represents the input to system 500 for input signals $I_1$ and $I_2$ both having values 1. Reference sign "b" in both masks 702 and 704 represents a bias to allow for negative weights as mentioned above. A value "1" is represented by a fully transparent region, like region 712, and a value "0" is represented by a fully opaque region, like region 714.

Weight mask 710 is designed so as to have laser 502 respond to a respective one of input masks 702–708 by a respective single spectral component. Weight mask 710 can be thought of as a two-dimensional array of rectangular regions, each with a particular transparency: the white regions (e.g., region 716) are fully transparent, the grey regions (e.g., region 718) are semi-transparent, and the black regions (e.g., region 720) are opaque.

Figure 8:
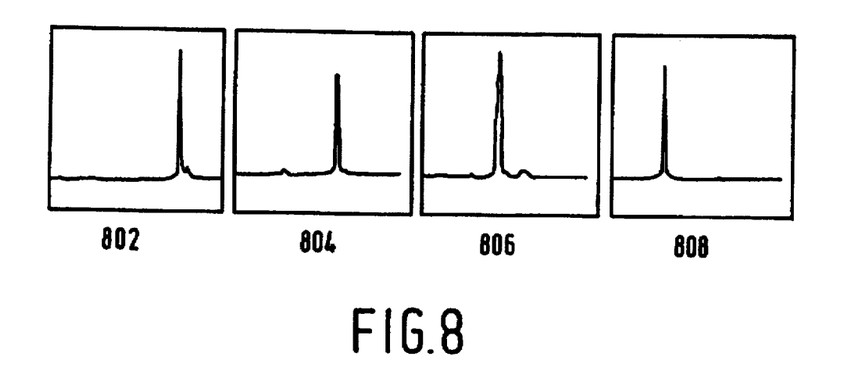

FIG. 8 illustrates output results 802, 804, 806 and 808 of neural net 500 for input masks 702, 704, 706 and 708, respectively, based on experiments. Each combination of input signals $I_1$ and $I_2$ clearly gives rise to another dominant spectral component in the produced laser light. For another particular distribution (not shown) of opaque, semi-transparent and fully transparent regions in weight mask 710 an XOR operation can be achieved.

Neural Net Embodiment, Second Example

Figure 9:
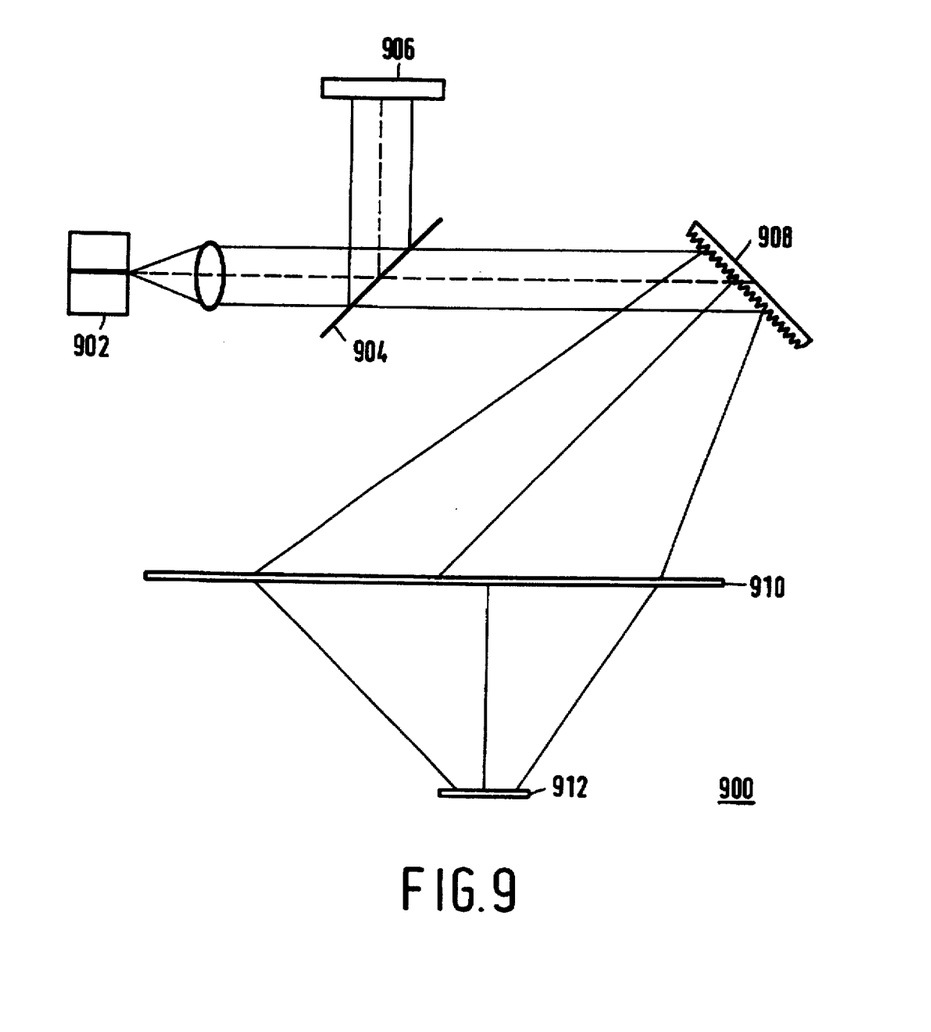
FIG. 9 gives a second detailed example of a neural net according to the invention.

FIG. 9 gives a second example of neural net 900 according to the invention. Net 900 comprises a multi-mode semiconductor laser 902, a semi-transparent mirror 904, a wavelength selective device 906, a grating 908, an optical medium 910 with spatially varying optical properties, and a detector array 912.

Laser 902 emits a laser beam composed of a plurality of spectral components towards semi-transparent mirror 904. Mirror 904 partially reflects the beam to wavelength selective device 906. Mirror 904 and device 906 form a wavelength-selective optical feedback path. The optical wavelength selective feedback to laser 902 accounts for the energy re-allocation among the laser's spectral components to generate a spectrum with predominant modes. For a more detailed discussion on the optical feedback and its consequences with respect to laser operation see above. The number of predominant modes may be one or more. In the latter case, the number of prevailing modes may be increased by use of a series of etalons, gratings or external resonators, as is clear to the skilled artisan.

As a result of the wavelength-selective feedback, semiconductor laser 902 emits a particular spectrum that is spatially dispersed via grating 908. Thereupon, the dispersed spectral components interact with medium 910 with spatially varying optical properties. Optical medium 910 is used to perform the neural net's weight function. Optical medium 910 is, for example, an optical disc, such as a common Compact-Disc (CD), with spatially varying reflectivity. Again, the location-dependent reflectivity gives rise to a selective feedback towards laser 902. In nowadays technology, a number of $10^6$ individual locations per $mm^2$ of surface of the optical disc is attainable to store $10^6$ weights for $10^3$ spectral components, each location containing a multitude of bits. A common CD is pre-formed. For adjustable weights, a phase-change material or a magneto-optic material can be used instead. The reflectivity of phase-change material is changed by applying a special (laser) light pulse to the material. The light's intensity and the duration of the pulse determine the resultant reflectivity.

Detector array 912 senses the transmitted laser light for each of the remaining spectral components individually and provides an output of neural net 900. Detector array 912 is comprised of, for example, a plurality of photo-detectors whose states govern electronic circuitry. Alternatively, detector array 912 may include one or more other semiconductor lasers taking over the role of one or more photo-detectors. In the latter case, optical injection effects the information processing in that the laser spectrum is altered, in a similar way as does the optical feedback discussed above.

Many of the functionalities of the system in the invention discussed above can be physically integrated with one another using photolithographic techniques known from integrated circuit manufacturing. For example, it is known to integrate a semiconductor laser with a grating in a semiconductor substrate. Such a configuration is commonly referred to as a distributed Bragg reflector. As another example, oxynitrid waveguides can be fabricated using photolithographic techniques.

We claim:

1. An optical information processing system functionally comprising:

coding means for individually coding a plurality of optical information carrier waves;

processing means coupled to the coding means for processing the plurality of coded information carrier waves, wherein the processing means comprises first laser means for producing laser light through longitudinal laser mode competition upon reception of the coded information carrier waves.

2. The system of claim 1, comprising a feedback loop wherein the first laser means supplies the plurality of optical information carrier waves to the coding means.

3. The system of claim 1, comprising second laser means for providing the plurality of optical information carrier waves.

4. The system of claim 3, wherein the second laser means comprises a semiconductor laser or a plurality of semiconductor lasers that are optically coupled through a transverse laser mode.

5. The system of claim 3, wherein at least the first laser means or the second laser means comprises a pulsed laser device.

6. The system of claim 1, wherein the first laser means comprises a semiconductor laser or a plurality of semiconductor lasers that are optically coupled through a transverse laser mode.

7. The system of claim 1, wherein each respective one of the optical information carrier waves comprises a respective spectral component in a longitudinal mode spectrum of the first laser means.

8. The system of claim 1, wherein the coding means codes the plurality of optical information carrier waves by controlling respective light intensities of respective ones of the plurality of optical information carrier waves.

9. The system of claim 8, wherein the coding means comprises at least one of the following devices:

an array of cells for modifying the light intensities and individually controllable through an input signal;

a fixed mask.

10. The system of claim 9, wherein the fixed mask comprises an optical disk.

11. The system of claim 1, wherein the first laser means comprises a pulsed laser device.

12. The system of claim 1, wherein the coding means and the processing means are physically integrated with one another.

* * * * *